United States Patent
Sakakibara et al.

(10) Patent No.: US 12,158,700 B2
(45) Date of Patent: Dec. 3, 2024

(54) PHOTOSENSITIVE RESIN COMPOSITION, METHOD FOR FORMING RESIST PATTERN, METHOD FOR MANUFACTURING PLATED MOLDED ARTICLE, AND SEMICONDUCTOR APPARATUS

(71) Applicant: JSR CORPORATION, Tokyo (JP)

(72) Inventors: Hirokazu Sakakibara, Tokyo (JP); Naoki Nishiguchi, Tokyo (JP); Takuhiro Taniguchi, Tokyo (JP); Tomoyuki Matsumoto, Tokyo (JP)

(73) Assignee: JSR CORPORATION, Tokyo (JP)

( * ) Notice: Subject to any disclaimer, the term of this patent is extended or adjusted under 35 U.S.C. 154(b) by 737 days.

(21) Appl. No.: 17/269,021

(22) PCT Filed: Jun. 14, 2019

(86) PCT No.: PCT/JP2019/023766
§ 371 (c)(1),
(2) Date: Feb. 17, 2021

(87) PCT Pub. No.: WO2020/039717
PCT Pub. Date: Feb. 27, 2020

(65) Prior Publication Data
US 2021/0325783 A1   Oct. 21, 2021

(30) Foreign Application Priority Data

Aug. 24, 2018   (JP) ................ 2018-157770

(51) Int. Cl.
| | | |
|---|---|---|
| *G03F 7/038* | (2006.01) | |
| *C08F 220/18* | (2006.01) | |
| *C08F 220/28* | (2006.01) | |
| *C25D 3/12* | (2006.01) | |
| *C25D 3/38* | (2006.01) | |

(Continued)

(52) U.S. Cl.
CPC .......... *G03F 7/0382* (2013.01); *C08F 220/18* (2013.01); *C08F 220/283* (2020.02); *C25D 3/12* (2013.01); *C25D 3/38* (2013.01); *C25D 5/022* (2013.01); *C25D 7/12* (2013.01);
(Continued)

(58) Field of Classification Search
CPC ....... G03F 7/0382; G03F 7/0392; C25D 3/12; C25D 3/38
See application file for complete search history.

(56) References Cited

U.S. PATENT DOCUMENTS 8,592,995 B2   11/2013   Lin et al.
9,128,376 B2    9/2015   Kato et al.
(Continued)

FOREIGN PATENT DOCUMENTS

JP   2004029437 A   1/2004
JP   2008058710 A   3/2008
(Continued)

OTHER PUBLICATIONS

International Search Report and Written Opinion issued Sep. 3, 2019 in PCT/JP2019/023766 (with English translation of Search Report), 12 pages.

(Continued)

*Primary Examiner* — Chanceity N Robinson
*Assistant Examiner* — Anna Malloy
(74) *Attorney, Agent, or Firm* — Element IP, PLC

(57) ABSTRACT

The present photosensitive resin composition includes a polymer (A) having a structural unit (a1) represented by a formula (a1), a structural unit (a2) represented by a formula (a2), and a structural unit (a3) represented by a formula (a3), and a photoacid generator (B). In the formulae (a1) to (a3), $R^{12}$, $R^{22}$, and $R^{32}$ each independently represent an organic group having 1 to 10 carbon atoms; $R^{21}$ represents a substituted or non-substituted alkyl group having 1 to 10 carbon atoms; $R^{31}$ represents a hydrogen atom, a substituted or non-substituted alkyl group having 1 to 10 carbon atoms, or a halogen atom; $R^{13}$ and $R^{23}$ each independently represent an acid dissociable group; $R^{33}$ represents a hydroxyaryl group; and l, m and n independently represent an integer from 0 to 10.

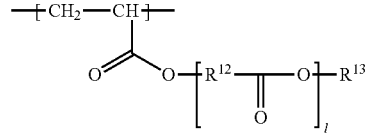

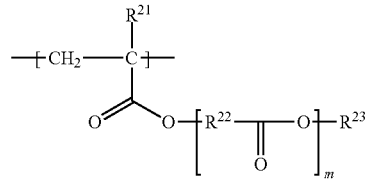

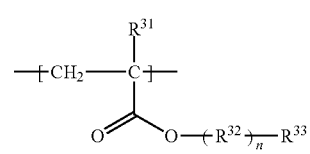

17 Claims, No Drawings

(51) Int. Cl.
    *C25D 5/02* (2006.01)
    *C25D 7/12* (2006.01)
    *G03F 7/004* (2006.01)
    *G03F 7/20* (2006.01)
    *G03F 7/32* (2006.01)
    *G03F 7/40* (2006.01)

(52) U.S. Cl.
    CPC .............. *G03F 7/0045* (2013.01); *G03F 7/20* (2013.01); *G03F 7/327* (2013.01); *G03F 7/40* (2013.01)

(56) References Cited

U.S. PATENT DOCUMENTS

| | | | |
|---|---|---|---|
| 9,323,152 B2 | 4/2016 | Irie | |
| 2007/0190465 A1* | 8/2007 | Nishikawa | C08F 220/1804 430/313 |
| 2007/0196765 A1 | 8/2007 | Mori et al. | |
| 2007/0269744 A1* | 11/2007 | Hada | G03F 7/0397 430/286.1 |
| 2011/0001250 A1 | 1/2011 | Lin et al. | |
| 2014/0248556 A1* | 9/2014 | Kato | H01L 21/0274 430/311 |
| 2015/0056557 A1* | 2/2015 | Irie | G03F 7/027 430/326 |

FOREIGN PATENT DOCUMENTS

| | | |
|---|---|---|
| JP | 2011029636 A | 2/2011 |
| JP | 2011095662 A | 5/2011 |
| JP | 2013137524 A | 7/2013 |
| JP | 2015041098 A | 3/2015 |
| KR | 20140090615 A | 7/2014 |
| TW | 200613915 A | 5/2006 |
| TW | 200804982 A | 1/2008 |
| TW | 201219969 A1 | 5/2012 |
| TW | 201321895 A1 | 6/2013 |

OTHER PUBLICATIONS

Office Action issued Jul. 24, 2023 in Taiwanese Patent Application No. 108123061 (with English translation), 16 pages.
Combined Taiwanese Office Action and Search Report issued Feb. 17, 2023 in Patent Application No. 108123061 (with English translation), 41 pages.
Office Action issued May 9, 2023 in Japanese Patent Application No. 2020-538198 (with English translation), 5 pages.
Office Action issued Dec. 13, 2022, in JP Patent Application No. 2020-538198 (with English translation), 10 pages.
Office Action issued Jan. 30, 2024, in corresponding Korean Patent Application No. 10-2021-7006791 (with machine English translation), 14 pages.
Combined Chinese Office Action and Search Report issued Feb. 3, 2024, in corresponding Chinese Patent Application No. 201980051934.9 (with English translation), 12, pages.
Office Action issued Jul. 4, 2024, in corresponding Chinese Patent Application No. 201980051934.9 (with English translation), 12 pages.

* cited by examiner

PHOTOSENSITIVE RESIN COMPOSITION, METHOD FOR FORMING RESIST PATTERN, METHOD FOR MANUFACTURING PLATED MOLDED ARTICLE, AND SEMICONDUCTOR APPARATUS

TECHNICAL FIELD

The present invention relates to a photosensitive resin composition, a method for forming a resist pattern, a method for manufacturing a plated formed article, and a semiconductor device.

BACKGROUND ART

Copper column solder bumps are used for solder electrodes used in connection terminals of semiconductor elements, display elements and the like, as the elements are highly integrated.

When the solder is lead-free solder, that is, tin solder, the copper-tin intermetallic compound is very fragile, so the copper column solder bumps are generally provided with a nickel-containing diffusion barrier layer between the copper column and the tin solder.

A copper column solder bump having such a copper column-nickel diffusion barrier layer-tin solder structure is usually manufactured by forming a resist pattern on a substrate including an element and the like, and forming a copper column using this resist pattern as a mold, then forming a diffusion barrier layer on the copper column by nickel plating, and finally forming tin solder on the diffusion barrier layer (see Patent Literature 1).

PRIOR TECHNICAL ART

Patent Literature

Patent Literature 1: JP 2011-029636 A

SUMMARY OF INVENTION

Technical Problems

As described above, resists used for manufacturing copper column solder bumps are required to be applicable to both copper plating and nickel plating.

The present disclosure has been made in view of the above circumstances, and an object thereof is to provide a photosensitive resin composition having excellent resolution and capable of forming a resist pattern which neither swells with a copper plating solution or a nickel plating solution, nor has any crack after treating a copper plating solution or nickel plating solution; to provide a method for forming a resist pattern using the photosensitive resin composition; to provide a method for manufacturing a plated formed article such as a copper column solder bump using a resist pattern formed by the resist pattern forming method; and to provide a semiconductor device having a plated formed article obtained by the plated formed article manufacturing method.

Solutions to Problems

The present disclosure contains, for example, the following contents [1] to [11].

[1] A photosensitive resin composition including:
a polymer (A) having a structural unit (a1) represented by the following formula (a1), a structural unit (a2) represented by the following formula (a2), and a structural unit (a3) represented by the following formula (a3); and
a photoacid generator (B).

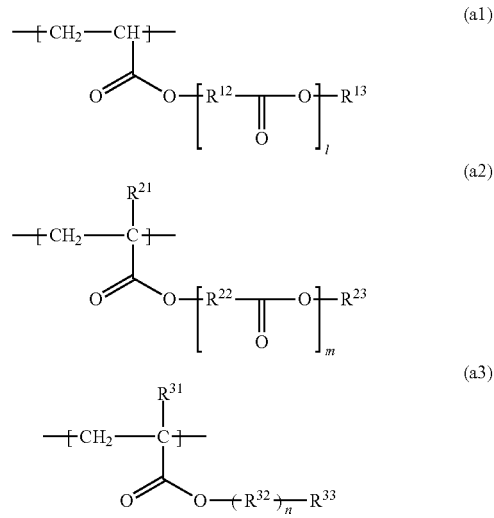

In the formulae (a1) to (a3), $R^{12}$, $R^{22}$, and $R^{32}$ each independently represent an organic group having 1 to 10 carbon atoms; $R^{21}$ represents a substituted or non-substituted alkyl group having 1 to 10 carbon atoms; $R^{31}$ represents a hydrogen atom, a substituted or non-substituted alkyl group having 1 to 10 carbon atoms, or a halogen atom; $R^{13}$ and $R^{23}$ each independently represent an acid dissociable group; $R^{33}$ represents a hydroxyaryl group; and l, m and n independently represent an integer from 0 to 10.

[2] The photosensitive resin composition according to [1] above, wherein a content ratio of the structural unit (a3) contained in the polymer (A) is in a range from 5% to 70% by mol when a total of all the structural units constituting the polymer (A) is 100% by mol.

[3] The photosensitive resin composition according to [1] or [2] above, wherein a total content ratio of the structural units (a1) and (a2) contained in the polymer (A) is in a range from 5% to 60% by mol when a total of all the structural units constituting the polymer (A) is 100% by mol.

[4] The photosensitive resin composition according to any one of [1] to [3] above, wherein a total content ratio of the structural units (a1) to (a3) contained in the polymer (A) is in a range from 50% to 100% by mol when a total of all the structural units constituting the polymer (A) is 100% by mol.

[5] The photosensitive resin composition according to any one of [1] to [4] above, wherein a content of the photoacid generator (B) included in the photosensitive resin composition is in a range from 0.1 to 20 parts by mass based on 100 parts by mass of the polymer (A).

[6] The photosensitive resin composition according to any one of claims 1 to 5, further including an organic solvent (C), wherein a content ratio of the organic solvent (C) included in the photosensitive resin composition is an amount such that a solid content concentration is in a range from 10% to 60% by mass.

[7] The photosensitive resin composition according to any one of [1] to [6] above, which is used for manufacturing a plated formed article.

[8] A method for forming a resist pattern including:
a step (1) of applying the photosensitive resin composition according to any one of [1] to [7] above onto a substrate to form a resin coating;
a step (2) of exposing the resin coating to light; and
a step (3) of developing the resin coating after the exposure.

[9] A method for manufacturing a plated formed article including a step (4) of performing a plating using a resist pattern formed by the resist pattern forming method according to [8] above as a mask.

[10] The method for manufacturing a plated formed article according to [9] above, wherein the plating is at least one selected from a copper plating and a nickel plating.

[11] A semiconductor device including a plated formed article obtained by the plated formed article manufacturing method according to [9] or [10] above.

Advantageous Effects of Invention

The photosensitive resin composition of the present disclosure is excellent in resolution, and can form a resist pattern which neither swells with a copper plating solution or a nickel plating solution, nor has any crack after treating a copper plating solution or nickel plating solution.

DESCRIPTION OF EMBODIMENTS

Hereinafter, the photosensitive resin composition (hereinafter, also referred to as "the present composition"), the method for forming a resist pattern, and the method for manufacturing a plated formed article, according to the present disclosure, will be described in detail.

For each of the components exemplified herein, for example, each of the components in the present composition and each of the structural units in the polymer (A), only one type thereof may be contained, or two or more types thereof may be contained, unless otherwise specified.

1. Photosensitive Resin Composition

The present composition includes a polymer (A) having a structural unit (a1) represented by the formula (a1), a structural unit (a2) represented by the formula (a2), and a structural unit (a3) represented by the formula (a3); and a photoacid generator (B).

In addition, the present composition may include an organic solvent (C), a quencher (D) and a surfactant (E), and any other component, if needed, as long as the effects of the present composition are not impaired.

Polymer (A)

The polymer (A) has a structural unit (a1) derived from an acrylic monomer having an acid dissociable group, a structural unit (a2) derived from a methacrylic monomer having an acid dissociable group, and the structural unit (a3) described above.

The polymer (A) may have, in addition to the structural units (a1) to (a3), a structural unit (hereinafter, also referred to as "structural unit (a4)") having a group that promotes solubility in an alkaline developer (hereinafter, also referred to as "solubility promoting group") other than the structural unit (a3), and other structural units (hereinafter, also referred to as "structural unit (a5)").

The structural units (a1) to (a3) may be contained in the same polymer or different polymers, but are preferably contained in the same polymer. For the polymer (A), only one type thereof or two or more types thereof may be contained.

The polymer (A) has an acid dissociable group in each of the structural units (a1) and (a2). The acid dissociable group dissociates by a function of an acid generated from the photoacid generator (B). As a result, a carboxy group is generated, the solubility of the polymer (A) in an alkaline developer changes, and the present composition can form a resist pattern.

In general, the resolution of the photosensitive resin composition for forming a thick-film resist pattern can be improved by increasing the rate of dissolution in the alkaline developer after dissociation of the acid dissociable groups of the acid dissociable group-containing polymer, such as the polymer (A) contained in the photosensitive resin composition.

Further, it is considered that the swelling resistance of the resist pattern against a plating solution and the crack resistance of the resist pattern after a plating process can be improved because the increase in glass transition temperature of the polymer having acid dissociable groups makes it possible to withstand pushing from the plating onto the resist pattern due to the plating growth.

When an alkyl group such as a methyl group is present at α-position, like a methacryl structure, in the polymer having an acid dissociable group, the rotation of the side chain of the structural unit is inhibited, so the glass transition temperature of the polymer having an acid dissociable group can be increased, but the rate of dissolution in an alkaline developer is lowered. On the other hand, when a substituent including an alkyl group such as a methyl group is not present at α-position, like an acrylic structure, in the polymer having an acid dissociable group, the rotation of the side chain of the structural unit is not inhibited, so the dissolution rate of the polymer having an acid dissociable group in an alkaline developer can be increased, but the glass transition temperature is decreased.

That is, in order to improve the resolution of the photosensitive resin composition and to improve the swelling resistance of the resist pattern to the plating solution and the crack resistance of the resist pattern after the plating process, it is considered necessary to achieve both the glass transition temperature of the polymer having an acid dissociable group and the rate of dissolution in an alkaline developer.

It is inferred that the present composition has the structural unit (a1) derived from an acrylic monomer having an acid dissociable group and a hydrogen atom at α-position, the structural unit (a2) derived from a methacrylic monomer having an acid dissociable group and a group that is represented by $R^{21}$ and is other than hydrogen atom at α-position, and the structural unit (a3) described above, thereby making it possible to attain both the glass transition temperature of the polymer having an acid dissociable group and the rate of dissolution in an alkaline developer, resulting in formation of a photosensitive resin composition having excellent resolution and capable of forming a resist pattern which neither swells with a copper plating solution or a nickel plating solution, nor has any crack after treating a copper plating solution or nickel plating solution.

The structural units described in the specification represent structures derived from monomers used in synthesis of the polymer. Examples of a monomer (a1') leading to the structural unit (a1) include a monomer having a polymerizable unsaturated double bond, which is represented by the following formula (a1').

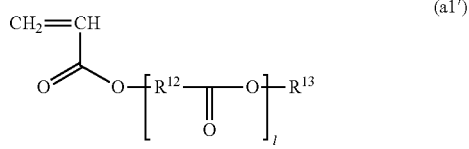

In the formula (a1), $R^{12}$, $R^{13}$, and l are synonymous with $R^{12}$, $R^{13}$, and l in the formula (a1), respectively.

Structural Unit (a1)

The structural unit (a1) is a structural unit represented by the following formula (a1) and is one derived from an acrylic monomer having an acid dissociable group and a hydrogen atom at α-position.

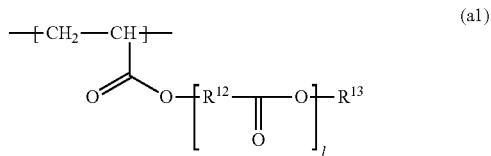

In the formula (a1), $R^{12}$ represents an organic group having 1 to 10 carbon atoms, $R^{13}$ represents an acid dissociable group, and l represents an integer of 0 to 10. l is preferably in a range from 0 to 5, and more preferably from 0 to 3.

Examples of the organic group having 1 to 10 carbon atoms as $R^{12}$ include an alkanediyl group such as methylene group, ethylene group, propane-1,3-diyl group, propane-1,2-diyl group, and decane-1,10-diyl group; and a group in which at least one hydrogen atom in the alkanediyl group is replaced with other group such as a halogen atom including fluorine atom and bromine atom, an aryl group such as phenyl group, hydroxyl group, and alkoxy group.

Examples of the acid dissociable group as $R^{13}$ include benzyl group and an acid dissociable group represented by the following formula (1) such as tert-butyl group, 1-alkylcyclopentan-1-yl group, and 2-alkyladamantan-2-yl group. Of these, the acid dissociable group represented by the following formula (1) is preferable.

In the formula (1), $R^{14}$ to $R^{16}$ each independently represent a substituted or non-substituted alkyl group, or a substituted or non-substituted alicyclic hydrocarbon group, or $R^{14}$ to $R^{16}$ form an alicyclic structure with a carbon atom bonded to $R^{14}$ to $R^{16}$; and * represents a bonded hand.

Examples of the substituted or non-substituted alkyl group as $R^{14}$ to $R^{16}$ include a non-substituted alkyl group such as methyl group, ethyl group, n-propyl group, isopropyl group, pentyl group and decyl group; a substituted alkyl group in which at least one hydrogen atom in the alkyl group is replaced with other group including a halogen atom such as fluorine atom and bromine atom, an aryl group such as phenyl group, a hydroxyl group, and an alkoxy group.

Examples of the substituted or non-substituted alicyclic hydrocarbon group as $R^{14}$ to $R^{16}$ include a monocyclic saturated cyclic hydrocarbon group such as cyclobutyl group, cyclopentyl group, cyclohexyl group, cycloheptyl group and cyclooctyl group; a monocyclic unsaturated cyclic hydrocarbon group such as cyclobutenyl group, cyclopentenyl group and cyclohexenyl group; and a polycyclic saturated cyclic hydrocarbon group such as norbornyl group, adamantyl group, tricyclodecyl group and tetracyclododecyl group.

Examples of the alicyclic structures composed of $R^{14}$ to $R^{16}$ and the carbon atom include a monocyclic saturated cyclic hydrocarbon structure such as cyclobutyl, cyclopentyl, cyclohexyl, cycloheptyl and cyclooctyl; a monocyclic unsaturated cyclic hydrocarbon structure such as cyclobutenyl, cyclopentenyl and cyclohexenyl; and a polycyclic saturated cyclic hydrocarbon structure such as norbornyl, adamantyl, tricyclodecyl and tetracyclododecyl.

Examples of the structural unit (a1) include structural units represented by the following chemical formulae.

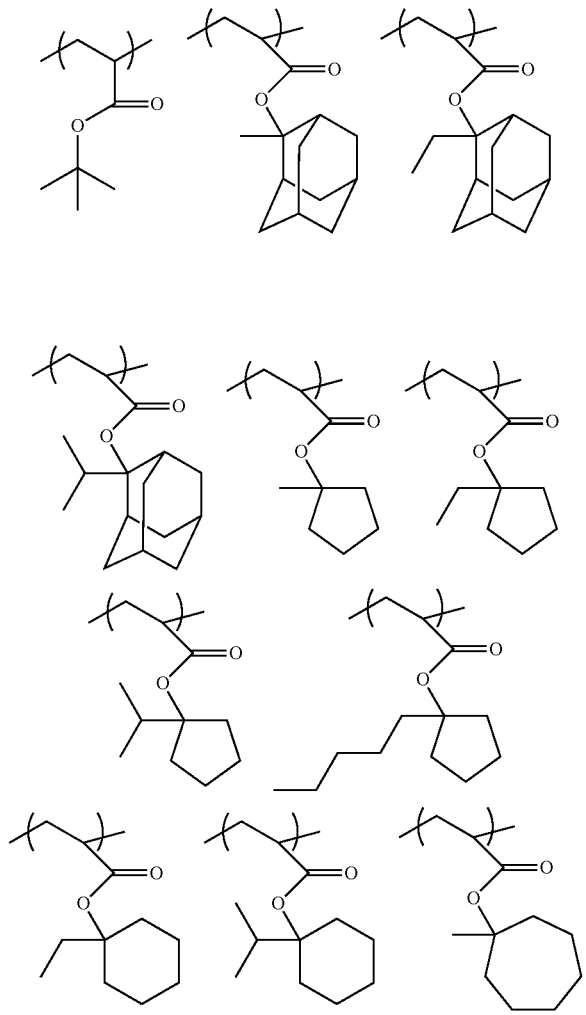

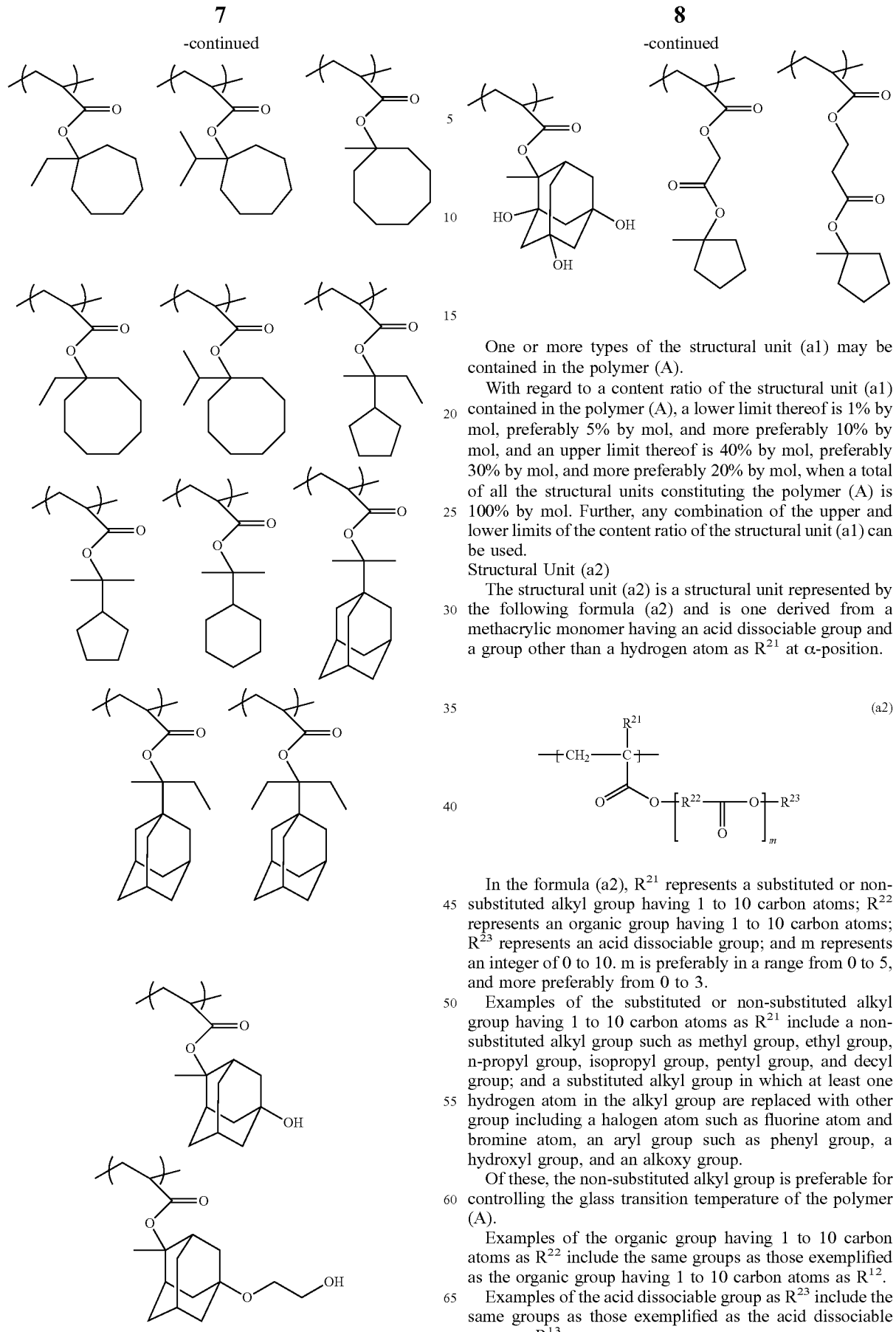

One or more types of the structural unit (a1) may be contained in the polymer (A).

With regard to a content ratio of the structural unit (a1) contained in the polymer (A), a lower limit thereof is 1% by mol, preferably 5% by mol, and more preferably 10% by mol, and an upper limit thereof is 40% by mol, preferably 30% by mol, and more preferably 20% by mol, when a total of all the structural units constituting the polymer (A) is 100% by mol. Further, any combination of the upper and lower limits of the content ratio of the structural unit (a1) can be used.

Structural Unit (a2)

The structural unit (a2) is a structural unit represented by the following formula (a2) and is one derived from a methacrylic monomer having an acid dissociable group and a group other than a hydrogen atom as $R^{21}$ at α-position.

$$\begin{array}{c} R^{21} \\ -\!\!\!-\!\!\!\left[\mathrm{CH}_2-\!\!\!\underset{|}{\mathrm{C}}\right]\!-\!\!- \\ \underset{\mathrm{O}}{\overset{\|}{\mathrm{C}}}-\mathrm{O}\!-\!\!\left[\mathrm{R}^{22}-\!\!\!\underset{\mathrm{O}}{\overset{\|}{\mathrm{C}}}-\mathrm{O}\right]_m\!\!\!-\!\mathrm{R}^{23} \end{array} \qquad (\text{a}2)$$

In the formula (a2), $R^{21}$ represents a substituted or non-substituted alkyl group having 1 to 10 carbon atoms; $R^{22}$ represents an organic group having 1 to 10 carbon atoms; $R^{23}$ represents an acid dissociable group; and m represents an integer of 0 to 10. m is preferably in a range from 0 to 5, and more preferably from 0 to 3.

Examples of the substituted or non-substituted alkyl group having 1 to 10 carbon atoms as $R^{21}$ include a non-substituted alkyl group such as methyl group, ethyl group, n-propyl group, isopropyl group, pentyl group, and decyl group; and a substituted alkyl group in which at least one hydrogen atom in the alkyl group are replaced with other group including a halogen atom such as fluorine atom and bromine atom, an aryl group such as phenyl group, a hydroxyl group, and an alkoxy group.

Of these, the non-substituted alkyl group is preferable for controlling the glass transition temperature of the polymer (A).

Examples of the organic group having 1 to 10 carbon atoms as $R^{22}$ include the same groups as those exemplified as the organic group having 1 to 10 carbon atoms as $R^{12}$.

Examples of the acid dissociable group as $R^{23}$ include the same groups as those exemplified as the acid dissociable group as $R^{13}$.

Examples of the structural unit (a2) include structural units represented by the following chemical formulae.

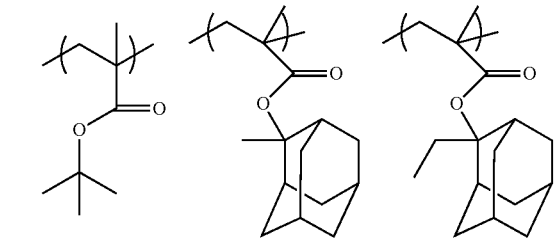
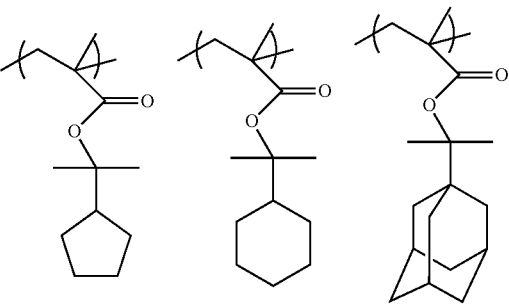
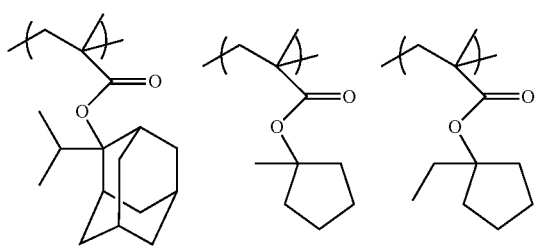
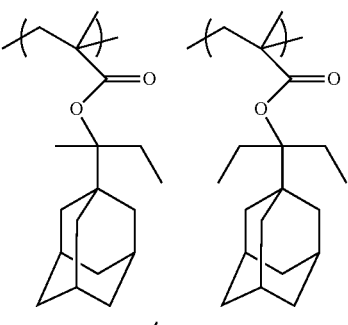
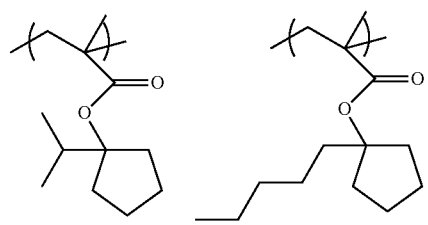
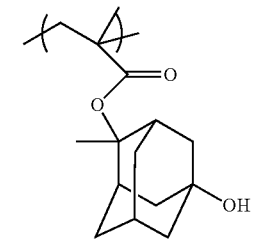
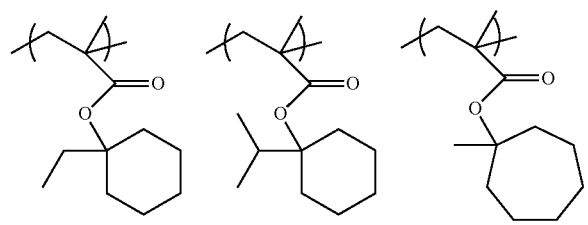
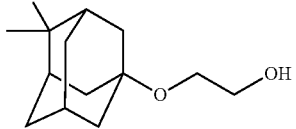
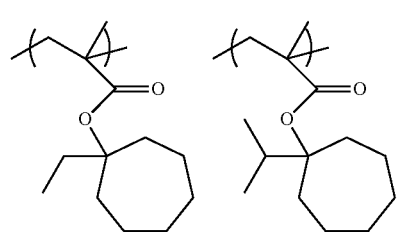
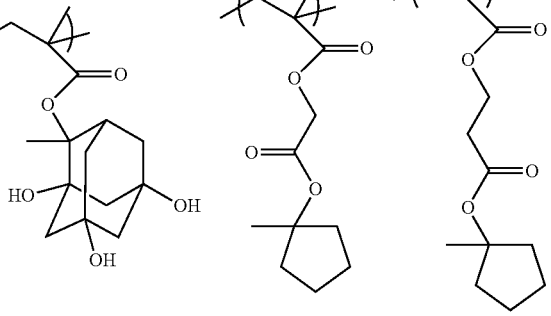
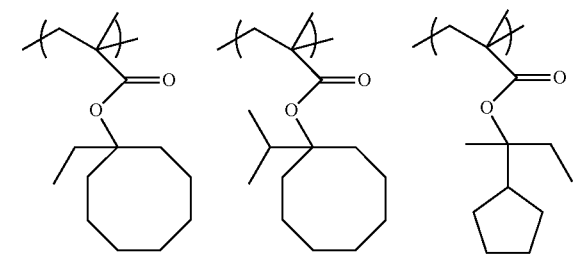

One or more types of the structural unit (a2) may be contained in the polymer (A).

With regard to a content ratio of the structural unit (a2) contained in the polymer (A), a lower limit thereof is 1% by mol, preferably 5% by mol, and more preferably 10% by mol, and an upper limit thereof is 40% by mol, preferably 30% by mol, and more preferably 20% by mol, when a total of all the structural units constituting the polymer (A) is 100% by mol. Further, any combination of the upper and lower limits of the content ratio of the structural unit (a2) can be used.

With regard to a ratio of total contents of the structural units (a1) and (a2) contained in the polymer (A), a lower limit thereof is 5% by mol, preferably 10% by mol, and more preferably 15% by mnol, and an upper limit thereof is 60% by mol, preferably 50% by mol, and more preferably 45% by mol, when a total of all the structural units constituting the polymer (A) is 100% by mol. Further, any combination of the upper and lower limits of the total content ratio of the structural units (a1) and (a2) can be used.

If the content ratio of the acid dissociable group that is contained in the polymer (A) and is to be dissociated by an acid is too high at the time of forming a thick-film resist pattern suitable for a mold of a plated formed article, the resist pattern may collapse after the step (3). On the other hand, if the content ratio of the acid dissociable group is too low, it may not be possible to form a thick-film resist pattern.

Structural Unit (a3)

The structural unit (a3) is a structural unit represented by the following formula (a3) and has a hydroxyaryl group which is a solubility promoting group. The presence of the structural unit (a3) in the polymer (A) makes it possible to increase the glass transition temperature of the polymer (A) and also to increase the rate of dissolution in an alkaline developer. As a result, the resolution of the present composition in a thick film can be improved, and a resist pattern that is compatible with both copper plating and nickel plating can be formed.

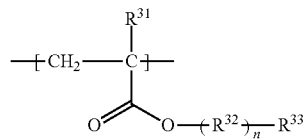

(a3)

In the formula (a3), $R^{31}$ each independently represents a hydrogen atom, a substituted or non-substituted alkyl group having 1 to 10 carbon atoms, or a halogen atom; $R^{32}$ represents an organic group having 1 to 10 carbon atoms; $R^{33}$ represents a hydroxyaryl group; n each independently represents an integer from 0 to 10.

Examples of the substituted or non-substituted alkyl group having 1 to 10 carbon atoms as $R^{31}$ include the groups exemplified as the substituted or non-substituted alkyl group having 1 to 10 carbon atoms as $R^{21}$.

Examples of the organic group having 1 to 10 carbon atoms as $R^{32}$ include the groups exemplified as the organic group having 1 to 10 carbon atoms as $R^{12}$. n is preferably in a range from 0 to 4, and more preferably 0.

Examples of the hydroxyaryl group as $R^{33}$ include a hydroxyphenyl group such as 2-hydroxyphenyl group, 3-hydroxyphenyl group, 4-hydroxyphenyl group, 3-methyl-4-hydroxyphenyl group, trihydroxyphenyl group, tetrahydroxyphenyl group, dihydroxybiphenyl group, and hydroxybenzenecarbonyl group; a hydroxynaphthyl group such as hydroxynaphthyl group, dihydroxynaphthyl group, and hydroxynaphthalenecarbonyl group; and a hydroxyanthryl group such as hydroxyanthracenecarbonyl group.

Among these, the hydroxyphenyl group can form a resist pattern having excellent plating solution resistance because it is compatible with plating.

A preferable structure of the structural unit (a3) is, for example, a structural unit (a31) represented by the following formula (a31).

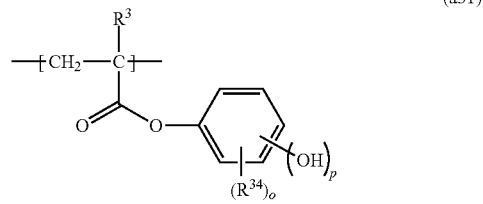

(a31)

In the formula (a31), $R^3$ is synonymous with $R^{31}$ in the structural unit (a3); $R^{34}$ is bonded to the benzene ring, representing a halogen atom, an alkyl group or an aryl group; —OH is bonded to the benzene ring; o indicates an integer of 0 to 4; p indicates an integer of 1 to 5; and a relationship o+p=5 is satisfied.

Examples of a monomer leading to the structural unit (a31) include a monomer (a31') represented by the following formula (a31').

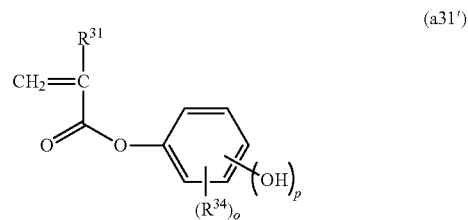

(a31')

In the formula (a31'), $R^{31}$, $R^{34}$, o, and p are synonymous with $R^{31}$ in the structural unit (a3), and $R^{34}$, o, and p in the formula (a31), respectively.

One or more types of the structural unit (a3) may be contained in the polymer (A).

With regard to a content ratio of the structural unit (a3) contained in the polymer (A), a lower limit thereof is 5% by mol, preferably 20% by mol, and more preferably 30% by mol, and an upper limit thereof is 70% by mol, preferably 65% by mol, and more preferably 60% by mol, when a total of all the structural units constituting the polymer (A) is 100% by mol. Further, any combination of the upper and lower limits of the content ratio of the structural unit (a3) can be used.

When the content ratio of the structural unit (a3) contained in the polymer (A) falls within the above range, it is possible to increase the glass transition temperature of the polymer (A) and also to increase the rate of dissolution in an alkaline developer. As a result, the resolution of the present composition in a thick film can be improved, and a resist pattern that is compatible with both copper plating and nickel plating can be formed.

With regard to a ratio of total contents of the structural units (a1) to (a3) contained in the polymer (A), a lower limit thereof is 50% by mol, preferably 55% by mol, and more preferably 60% by mnol, and an upper limit thereof is 100% by mol, preferably 95% by mol, and more preferably 90% by mol, when a total of all the structural units constituting the polymer (A) is 100% by mol. Further, any combination of the upper and lower limits of the total content ratio of the structural units (a1) to (a3) can be used.

When the total content ratio of the structural units (a1) to (a3) contained in the polymer (A) falls within the above range, it is possible to increase the glass transition temperature of the polymer (A) and also to increase the rate of dissolution in an alkaline developer. As a result, the resolution of the present composition in a thick film can be improved, and a resist pattern that is compatible with both copper plating and nickel plating can be formed.

Structural Unit (a4)

The structural unit (a4) is a structural unit having a solubility promoting group other than the structural unit (a3). The presence of the structural unit (a4) in the polymer (A) makes it possible to adjust the resolution, sensitivity, depth of focus, exposure latitude, and other lithographic properties to a resin coating formed from the present composition.

Examples of the structural unit (a4) include a structural unit having a carboxy group, a hydroxyaryl group, a hydroxy group, a lactone structure, a cyclic carbonate structure, a sultone structure, or a fluoroalcohol structure. Among these, a structural unit having a hydroxyaryl group is preferable because the resist pattern formed from the present composition is resistant to pushing from the plating at the time of forming a plated formed article.

Examples of the structural unit having a carboxy group include a structural unit derived from a monomer such as (meth)acrylic acid, crotonic acid, maleic acid, fumaric acid, cinnamic acid, 2-carboxyethyl (meth)acrylate, 2-carboxypropyl (meth)acrylate, and 3-carboxypropyl (meth)acrylate.

Examples of the structural unit having a hydroxyaryl group include a structural unit derived from a vinyl-based monomer such as 2-hydroxystyrene, 4-hydroxystyrene, 4-isopropenylphenol, 4-hydroxy-1-vinylnaphthalene, and 4-hydroxy-2-vinylnaphthalene.

Examples of the structural unit having a hydroxy group include a structural unit derived from a monomer such as 2-hydroxyethyl (meth)acrylate and 3-(meth)acryloyloxy-4-hydroxytetrahydrofuran, and structural units described in paragraph [0030] of JP 2009-276607 A.

Examples of the structural unit having a lactone structure include structural units described in paragraphs [0104] to [0107] of JP 2017-058421 A, structural units described in paragraph [0028] of WO 2009/113228, structural units described in paragraphs [0133] to [0134] of JP 2010-138330 A, structural units described in paragraphs [0064], [0093] and [0095] of JP 2010-275555 A, structural units derived from the monomer described in paragraph [0019] of JP 2016-098350 A, and structural units derived from the monomers described in paragraphs [0017] to [0023] of JP 2015-214634 A.

Examples of the structural unit having a cyclic carbonate structure include structural units described in paragraphs [0105] to [0106] of JP 2017-058421 A, structural units derived from the monomers described in paragraphs [0034] of JP 2009-223294 A, and structural units derived from the monomers described in paragraph [0092] of JP 2017-044875 A.

Examples of the structural unit having a sultone structure include structural units described in paragraph [0106] of JP 2017-058421 A, structural units described in paragraphs [0024] to [0028] of JP 2014-029518 A, structural units described in paragraphs [0033] and [0036] of JP 2016-061933 A, and structural unit described in paragraph [0087] of JP 2013-007846 A.

Examples of the structural unit having a fluoroalcohol structure include structural units derived from the monomers described in paragraphs [0066], [0069] and [0071] of JP 2004-083900 A, structural unit described in paragraph [0023] of JP 2003-002925 A, structural units described in paragraphs [0043], [0045], and [0047] of JP 2004-145048 A, and structural units derived from the monomers described in paragraph [0034] of JP 2005-133066 A.

In addition, the structural units described in the known documents indicated above shall be described herein.

A content ratio of a total of the structural units (a3) and (a4) contained in the polymer (A) is usually in a range from 10% to 80% by mol, when a total of all the structural units constituting the polymer (A) is 100% by mol.

Structural Unit (a5)

The structural unit (a5) is a structural unit other than the structural units (a1) to (a4).

Examples of the structural unit (a5) include a structural unit derived from a vinyl compound such as styrene, 2-methylstyrene, 3-methylstyrene, 4-methylstyrene, 2-methoxystyrene, 3-methoxystyrene, and 4-methoxystyrene;

a structural unit derived from an aliphatic (meth)acrylic acid ester compound such as methyl (meth)acrylate, ethyl (meth)acrylate, n-pentyl (meth)acrylate, neopentyl (meth)acrylate, n-hexyl (meth)acrylate, and 2-ethylhexyl (meth)acrylate;

a structural unit derived from an alicyclic (meth)acrylic acid ester compound such as cyclopentyl (meth)acrylate, norbornyl (meth)acrylate, isobornyl (meth)acrylate, tricyclodecanyl (meth)acrylate, dicyclopentenyl (meth)acrylate, tetrahydrofuranyl (meth)acrylate, and tetrahydropyranyl (meth)acrylate;

a structural unit derived from an aromatic-containing (meth)acrylic acid ester compound such as phenyl (meth)acrylate and phenethyl (meth)acrylate;

a structural unit derived from an unsaturated nitrile compound such as (meth)acrylonitrile, crotononitrile, maleinitrile, and fumaronitrile;

a structural unit derived from an unsaturated amide compound such as (meth)acrylamide and N,N-dimethyl (meth)acrylamide; and a structural unit derived from an unsaturated imide compound such as maleimide, N-phenylmaleimide, and N-cyclohexylmaleimide.

A content ratio of the structural unit (a5) contained in the polymer (A) is usually 40% or less by mol, when a total of all the structural units constituting the polymer (A) is 100% by mol.

Production Method of Polymer (A)

The polymer (A) can be produced by polymerizing the monomers leading to the respective structural units by a publicly known polymerization method such as ionic polymerization method and radical polymerization method. From a viewpoint of mass productivity, it is preferable to produce the polymer (A) by radical polymerization method among these methods.

Examples of a radical polymerization initiator used in the radical polymerization method include an azo compound such as 2,2'-azobisisobutyronitrile and 2,2'-azobis-(2,4-dimethylvaleronitrile); an organic peroxide such as benzoyl peroxide, lauryl peroxide, and t-butyl peroxide; and the like.

A solvent used in the radical polymerization method is not particularly limited as long as it dissolves the produced polymer (A) but not react with the monomer components. Example thereof includes n-butyl acetate, methyl isobutyl ketone, 2-heptanone, cyclohexanone, propyleneglycol monomethylether, propyleneglycol monomethylether acetate, methyl 3-methoxypropionate, ethyl 3-ethoxypropionate, ethyl lactate, and the like. The polymerization solvent may be singly or in combination of two or more types thereof.

A weight average molecular weight (hereinafter referred to as "Mw") of the polymer (A) in terms of polystyrene as measured by gel permeation chromatography is usually in a range from 1,000 to 500,000, preferably from 3,000 to 300,000, more preferably from 10,000 to 100,000, and further preferably from 20,000 to 60,000.

A ratio (Mw/Mn) of the Mw of the polymer (A) to a number average molecular weight (hereinafter referred to as "Mn") of the polymer (A) in terms of polystyrene as measured by gel permeation chromatography is usually in a range from 1 to 5, and preferably from 1 to 3.

Moreover, a molecular weight regulator such as a mercaptan compound and a halogenated hydrocarbon may be used as needed.

Photoacid Generator (B)

The photoacid generator (B) is a compound that generates an acid upon exposure. The generated acid leads to dissociation of the acid dissociable groups in the polymer (A) and an acidic functional group such as carboxy group and hydroxyaryl group is formed. As a result, the exposed part of the photosensitive resin coating formed from the photosensitive resin composition becomes easily soluble in the alkaline developer, so that a positive-type resist pattern can be formed.

Examples of the photoacid generator (B) include compounds described in paragraphs [0017] to [0026], [0028] to [0039], [0042] to [0046], [0049] and [0053] of JP 2004-317907 A, compounds described in paragraphs [0090] to [0106] of JP 2014-157252 A, compounds described in paragraphs [0117] to [0123] of JP 2002-268223 A, and compounds described in paragraphs [0038] to [0041] of JP 2017-102260 A. These compounds shall be described herein.

Examples of the photoacid generator (B) include an onium salt compound such as diphenyliodonium trifluoromethanesulfonate, diphenyliodonium-p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium hexafluoroantimonate, triphenylsulfonium hexafluorophosphate, 4-t-butylphenyl/diphenylsulfonium trifluoromethanesulfonate, 4-t-butylphenyl•diphenylsulfoniumbenzenesulfonate, 4,7-di-n-butoxynaphthyl tetrahydrothiophenium trifluoromethanesulfonate, 4,7-di-n-butoxynaphthyl tetrahydrothiophenium•bis(trifluoromethanesulfonyl)imide anion, and 4,7-di-n-butoxynaphthyl tetrahydrothiophenium•tris (nonafluorobutylsulfonyl)methide;

a halogen-containing compound such as 1,10-dibromo-n-decane, 1,1-bis(4-chlorophenyl)-2,2,2-trichloroethane, phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine;

a sulfone compound such as 4-trisphenacyl sulfone, mesitylphenacyl sulfone, and bis(phenylsulfonyl)methane;

a sulfonic acid compound such as benzoin tosylate, pyrogalloltristrifluoromethanesulfonate, o-nitrobenzyltrifluoromethanesulfonate, and o-nitrobenzyl-p-toluenesulfonate;

a sulfonimide compound such as N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)-4-butyl-naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxyimide, N-(4-fluorophenylsulfonyloxy)bicyclo [2.1.1] heptane-5,6-oxy-2,3-dicarboxyimide, N-(4-fluorophenylsulfonyloxy) naphthylimide, and N-(10-camphor-sulfonyloxy) naphthylimide; and a diazomethane compound such as bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, cyclohexylsulfonyl-1,1-dimethylethyl sulfonyldiazomethane, and bis(1,1-dimethylethylsulfonyl)diazomethane.

Among these, the onium salt compound or the sulfonimide compound are preferable because they can form a resist pattern having excellent resolution and plating solution resistance.

The photoacid generator (B) may be used singly or in combination of two or more types thereof.

With regard to a content of the photoacid generator (B) in the present composition, a lower limit thereof is 0.1 part by mass, preferably 0.3 part by mass, more preferably 0.5 part by mass, and further preferably 1 part by mass, and an upper limit thereof is 20 parts by mass, preferably 15 parts by mass, more preferably 10 parts by mass, and further preferably 5 parts by mass based on 100 parts by mass of the polymer (A). Further, any combination of the upper and lower limits of the content ratio of the photoacid generator (B) can be used. When the content of the photoacid generator (B) falls within the above range, a resist pattern which is a thick film and has excellent resolution can be obtained, and a pattern having an excellent shape can be obtained.

Organic Solvent (C)

The organic solvent (C) is a component used to uniformly mix the respective components contained in the present composition.

Examples of the organic solvent (C) include an alcohol such as ethyleneglycol monomethyl ether, ethyleneglycol monoethyl ether, diethyleneglycol, diethyleneglycol monoethyl ether, ethyl lactate, and propylene glycol monomethyl ether; an ester such as ethyl acetate, ethyl 2-hydroxypropionate, ethyl 2-hydroxy-2-methylpropionate, methyl acetoacetate, and ethyl ethoxyacetate; a ketone such as methyl amyl ketone and cyclohexanone; an alkylene glycol dialkyl ether such as diethyleneglycol dimethyl ether, diethyleneglycol diethyl ether, diethyleneglycol di-n-propyl ether, and dipropyleneglycol dimethyl ether; and an alkylene glycol monoalkyl ether acetate such as ethyleneglycol monomethyl ether acetate, ethyleneglycol monoethyl ether acetate, propyleneglycol monomethyl ether acetate, propyleneglycol monoethyl ether acetate, and propyleneglycol mono-n-propyl ether acetate.

The organic solvent (C) may be used singly or in combination of two or more types thereof.

With regard to a content of the organic solvent (C) in the present composition, a lower limit of a solid content concentration is 10% by mass, preferably 20% by mass, and further preferably 25% by mass, and an upper limit thereof is 60% by mass, preferably 55% by mass, and further preferably 50% by mass. Further, any combination of the upper and lower limits of the content ratio of the organic solvent (C) can be used. Within the above range, a thick-film resist pattern can be formed satisfactorily. The solid content concentration refers to a content ratio of all the components other than the organic solvent (C) contained in the present composition.

Quencher (D)

The quencher (D) is a component used to control the diffusion of the acid generated from the photoacid generator (B) upon exposure in the resist film, and as a result, the resolution of the present composition can be improved.

Examples of the quencher (D) include a basic compound, a compound that generates a base, and the like. Specific examples include compounds described in paragraphs [0076],[0079], and [0081] of JP 2014-013381 A, compounds described in paragraphs [0101] to [0104] of JP 2016-099483 A, and compounds described in paragraphs [0221] to [0224] of JP 2017-037320 A. These compounds shall be described herein.

Examples of the quencher (D) include an alkylamine such as n-hexylamine, n-heptylamine, di-n-butylamine, and tri-ethylamine; an aromatic amine such as aniline and 1-naphthylamine; an alkanolamine such as triethanolamine; a polyamino compound such as ethylenediamine, 1,3-bis [1-(4-aminophenyl)-1-methylethyl]benzene, and polyethylene imine; an amide compound such as formamide; a urea compound such as urea and methylurea; a nitrogen-containing heterocyclic compound such as imidazole and benzimidazole; and a nitrogen-containing compound having an acid dissociable group such as N-(t-butoxycarbonyl)piperidine, N-(t-butoxycarbonyl)imidazole, N-(t-butoxycarbonyl)benzimidazole, and N-(t-butoxycarbonyl)-2-phenylbenzimidazole.

The quencher (D) may be used singly or in combination of two or more types thereof.

A content of the quencher (D) contained in the present composition is usually in a range from 0.001 to 10 parts by mass based on 100 parts by mass of the polymer (A).

Surfactant (E)

The surfactant (E) has a function of improving the coatability, defoaming property, and the like of the present composition.

A publicly known surfactant can be used as the surfactant (E). Examples of commercially available surfactant include NBX-15, FTX-204D, FTX-208D, and FTX-212D (all manufactured by Neos Co., Ltd.); BM-1100 (manufactured by BM Chemie); Megaface F142D (manufactured by Dainippon Ink and Chemicals, Inc.); Fluorad FC-135, FC-170C, FC-430, and FC-431 (all manufactured by Sumitomo 3M Ltd.); Surflon S-112 and S-145 (both manufactured by Asahi Glass Co., Ltd.); and SH-28PA and SF-190 (both manufactured by Dow Corning Toray Silicone Co., Ltd.).

The surfactant (E) may be used singly or in combination of two or more types thereof.

A content of the surfactant (E) contained in the present composition is usually 2 parts or less by mass based on 100 parts by mass of the polymer (A).

Other Components

Examples of other components include a sensitizer which absorbs exposure light and improves the acid generation efficiency of the photoacid generator; an alkali-soluble resin such as phenol novolac resin or poly(hydroxystyrene) and a low-molecular-weight phenol compound, which control the dissolution rate of the resin coating formed from the photosensitive resin composition in the alkaline developer; a UV absorber that blocks a photoreaction due to leakage of scattered light to the unexposed part during light exposure; a thermal polymerization inhibitor which enhances storage stability; an antioxidant; an adhesion aid; and an inorganic filler.

Production of Photosensitive Resin Composition

The present composition can be produced by uniformly mixing the respective components. In addition, in order to remove dust, after uniform mixing of the components, the resultant mixture may be filtered through a filter or the like.

2. Method for Forming Resist Pattern

The method for forming a resist pattern of the present disclosure (hereinafter, referred to as "the present method for forming a resist pattern") includes:

a step (1) of applying the present composition onto a substrate to form a resin coating;

a step (2) of exposing the resin coating to light; and a step (3) of developing the resin coating after the exposure.

Step (1)

The step (1) is a step of forming a resin coating of the present composition on a substrate.

Examples of the substrate include a semiconductor substrate, a glass substrate, and a substrate whose surface is provided with a various metal film and the like. A shape of the substrate is not particularly limited, and a surface shape may be flat or uneven. The shape of the substrate may be circular and square. Moreover, there is no limitation on a size of the substrate.

Examples of material for the metal film include aluminum, copper, silver, gold, palladium, and an alloy containing two or more types of these metals. The metal film can be formed by a sputtering method or the like. A thickness of the metal film is usually in a range from 100 to 10,000 Å, and preferably from 500 to 2,000 Å.

Examples of a method for applying the present composition include spin coating, roll coating, screen printing, and an applicator method. Among these methods, spin coating is preferable. In the case of spin coating, a rotational speed is usually in a range from 500 to 4,000 rpm, and preferably from 800 to 3,500 rpm.

After the application of the present composition, the resin coating may be subjected to heat treatment. Conditions for the heat treatment are usually from 0.5 to 20 minutes at a temperature ranging from 50° C. to 200° C. A film thickness of the resin coating is usually in a range from 1 to 100 μm, and preferably from 5 to 80 μm.

Step (2)

The step (2) is a step of exposing the resin coating formed in the step (1) to light.

The exposure is usually carried out selectively on the resin coating via a photomask having a predetermined mask pattern by reduced projection exposure.

A laser light having a wavelength ranging from 150 to 600 nm, preferably a laser light having a wavelength ranging from 200 to 500 nm is usually used as an exposure light. An exposure dose is usually in a range from 100 to 20,000 mJ/cm$^2$.

After the exposure, heat treatment can be performed. Conditions for heat treatment are usually from 1 to 10 minutes at a temperature ranging from 70° C. to 180° C.

Step (3)

The step (3) is a step of developing the resin coating after the exposure in the step (2) to form a resist pattern.

The development is usually carried out with an alkaline developer. Examples of the developing method for the development include a shower developing method, a spray developing method, a dipping developing method, a paddle developing method, and the like. Conditions for the development are usually from 1 to 30 minutes at a temperature of 23° C.

Examples of the alkaline developer include an aqueous solution containing at least one type of an alkaline substance such as sodium hydroxide, potassium hydroxide, sodium carbonate, sodium silicate, ammonia water, ethylamine, n-propylamine, diethylamine, triethylamine, monoethanolamine, diethanolamine, triethanolamine, tetramethylammonium hydroxide, tetraethylammonium hydroxide, choline, pyrrole, and piperidine. The alkaline developer may contain an organic solvent such as methanol and ethanol, a surfactant, or the like.

After the development, the resist pattern may be washed with water or the like. It may then be dried with an air gun or hot plate.

3. Method for Manufacturing Plated Formed Article

The method for manufacturing a plated formed article of the present disclosure (hereinafter, also referred to as "the present method for manufacturing a plated formed article") involves manufacturing a plated formed article using a resist pattern formed by the present resist pattern forming method as a mask.

The present method for manufacturing a plated formed article includes a step (4) of performing a plating using the resist pattern formed in the step (3) as a mold.

Specifically, an electrolytic plating is carried out using the resist pattern as a mold to form a plated formed article (for example, an electrode material). At this time, in order to improve the affinity between the pattern surface and the plating solution, the resist pattern may be hydrophilized, for example, by ashing treatment with oxygen plasma.

Examples of the plating solution used in the electrolytic plating include one containing copper, gold, silver, or nickel. Examples of the electrolytic plating include a copper plating using copper sulfate, and a nickel plating using nickel sulfate.

Conditions for the electrolytic plating vary depending on a composition of the plating solution and the like. For example, when the plating solution is a copper plating solution, the temperature is usually in a range from 10° C. to 90° C., and preferably from 20° C. to 70° C., and the current density is usually in a range from 0.3 to 30 Å/dm², and preferably from 0.5 to 20 Å/dm².

When the plating solution is a nickel plating solution, the temperature is usually in a range from 20° C. to 90° C., and preferably from 40° C. to 70° C., and the current density is usually in a range from 0.3 to 30 Å/dm², and preferably from 0.5 to 20 Å/dm².

The plating is followed by washing with water and drying. Then, the state of the pattern, the thickness and state of the plated formed article, and the like are observed, and electrolytic plating is performed again as needed.

A thickness of the plated formed article manufactured by the present plated formed article manufacturing method may be appropriately selected depending on the intended use of the plated formed article. For example, when the intended use of the plated formed article is a bump, the thickness is usually in a range from 5 to 100 μm, preferably from 10 to 80 μm, and further preferably from 20 to 60 μm. When the intended use of the plated formed article is wiring, the thickness is usually in a range from 1 to 30 μm, preferably from 3 to 20 μm, and further preferably from 5 to 15 μm.

Other Steps

The present method for manufacturing a plated formed article may further include a step (5) of removing the resist pattern after the step (4).

The step (5) is a step of stripping and removing the resist pattern that remains on the substrate after the step (4). For example, a method of immersing the substrate having the resist pattern after the step (4) in a stripping solution being stirred at a temperature ranging from 20° C. to 80° C. for 1 to 10 minutes may be applicable.

Examples of the stripping solution include a solution containing tetramethyl ammonium hydroxide, dimethyl sulfoxide and/or N,N-dimethylformamide.

The present method for manufacturing a plated formed article may include a step of removing a region other than the region where the plated formed article is formed, for example, by a wet etching method.

4. Semiconductor Device

The semiconductor device of the present disclosure includes a plated formed article obtained by the present plated formed article manufacturing method. The present semiconductor device is provided with a plated formed article in which the resist pattern is copied through a plating process to deposit a plating component using the present resist pattern which is useful as a mold for plating process, and thus reliability is improved. Specific examples of the semiconductor device include a multilayer LSI (semiconductor integrated circuit, see http://www.jmq.jsr.co.jp/products.html).

EXAMPLES

Hereinafter, the present invention will be described in more detail based on Examples, but is not limited thereto. In the description of the following Examples and the like, "part" is used to mean "part by mass".

<Method for Measuring Physical Property>

(Method for Measuring Weight Average Molecular Weight (Mw) of Polymer)

The weight average molecular weight (Mw) of an alkali-soluble resin was measured by gel permeation chromatography method under the following conditions.

Column: Columns TSK-M and TSK2500 manufactured by Tosoh Corporation, which were connected in series
Solvent: Tetrahydrofuran
  Flow rate: 0.35 mL/min
  Temperature: 40° C.
  Detection method: Refractive index method
  Standard substance: Polystyrene
  GPC device: "HLC-8220-GPC" (type name) manufactured by Tosoh Corporation <Production of Polymer>

Synthesis Examples

Polymers (A1) to (A6) and (RA1) to (RA3) having structural units and content ratios shown in Table 1 were produced by radical polymerization using 2,2'-azobis (methyl isobutyrate) as a radical polymerization initiator. Details of the structural units shown in Table 1 are represented by the following formulae (a1-1) to (a1-2), (a2-1) to (a2-3), (a3-1), (a4-1) and (a5-1). The unit of numerical values in Table 1 is % by mol.

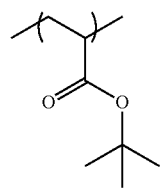

a1-1

-continued a1-2

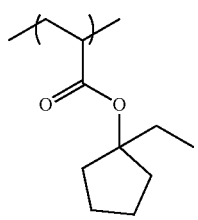

a2-1

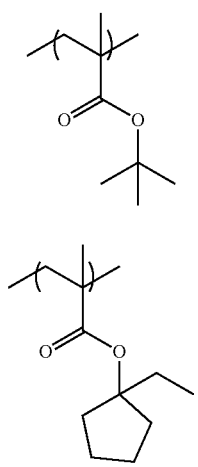

a2-2 a2-3 a3-1

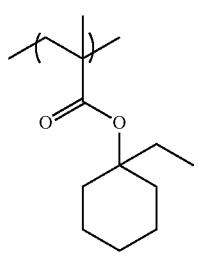

a4-1

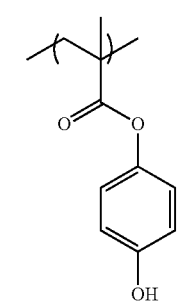

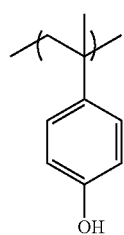

-continued a5-1

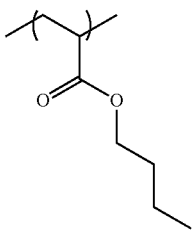

TABLE 1

| Polymer | a1-1 | a1-2 | a2-1 | a2-2 | a2-3 | a3-1 | a4-1 | a5-1 | Mw |
|---|---|---|---|---|---|---|---|---|---|
| A1 | 15 | | 10 | 10 | | 50 | | 15 | 41,000 |
| A2 | 15 | | | 20 | | 50 | | 15 | 44,500 |
| A3 | | 20 | 15 | | | 50 | | 15 | 45,020 |
| A4 | | 10 | 15 | 10 | | 50 | | 15 | 49,000 |
| A5 | 15 | | | | 10 | 40 | 20 | 15 | 42,000 |
| A6 | 15 | | | 10 | | 40 | 20 | 15 | 45,100 |
| RA1 | 15 | | 10 | 10 | | | 50 | 15 | 45,000 |
| RA2 | | | 25 | 10 | | 50 | | 15 | 47,400 |
| RA3 | 35 | | | | | 50 | | 15 | 44,000 |

<Production of Photosensitive Resin Composition>

Examples 1A to 9A and Comparative Examples 1A to 3A (Production of Photosensitive Resin Composition)

Photosensitive resin compositions containing types and amounts of components shown in Table 2 were produced by uniformly mixing the respective components. Details of the components, other than the polymers, shown in Table 2 are as follows. The unit of numerical values in Table 2 is part by mass.

B1: Compound having a structure represented by the following formula (B1)

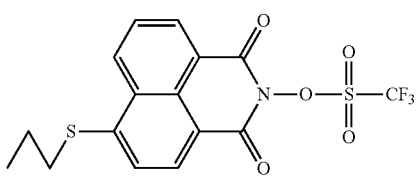

(B1)

D1: Compound having a structure represented by the following formula (D1)

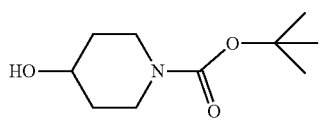

(D1)

E1: "NBX-15" (product name) manufactured by Neos Co., Ltd.
C1: Propyleneglycol monomethyl ether acetate
C2: Methyl amyl ketone
C3: γ-Butyrolactone
C4: Dipropyleneglycol monomethyl ether acetate

TABLE 2

| Component | Example 1A | Example 2A | Example 3A | Example 4A | Example 5A | Example 6A | Example 7A | Example 8A | Example 9A | Comparative Example 1A | Comparative Example 2A | Comparative Example 3A |
|---|---|---|---|---|---|---|---|---|---|---|---|---|
| A1 | 19 | | | | | | 19 | 19 | 19 | | | |
| A2 | | 19 | | | | | | | | | | |
| A3 | | | 19 | | | | | | | | | |
| A4 | | | | 19 | | | | | | | | |
| A5 | | | | | 19 | | | | | | | |
| A6 | | | | | | 19 | | | | | | |
| RA1 | | | | | | | | | | 19 | | |
| RA2 | | | | | | | | | | | 19 | |
| RA3 | | | | | | | | | | | | 19 |
| B1 | 1 | 1 | 1 | 1 | 1 | 1 | 1 | 1 | 1 | 1 | 1 | 1 |
| D1 | 0.05 | 0.05 | 0.05 | 0.05 | 0.05 | 0.05 | 0.05 | 0.05 | 0.05 | 0.05 | 0.05 | 0.05 |
| E1 | 0.01 | 0.01 | 0.01 | 0.01 | 0.1 | 0.1 | | | | 0.01 | 0.01 | 0.01 |
| C1 | 24 | 24 | 24 | 24 | 24 | 24 | 19 | 19 | 19 | 24 | 24 | 24 |
| C2 | | | | | | | 5 | | | | | |
| C3 | | | | | | | | 5 | | | | |
| C4 | | | | | | | | | 5 | | | |

<Formation of Resist Pattern>

Examples 1B to 9B and Comparative Examples 1B to 3B (Formation of Resist Pattern)

The photosensitive resin compositions of Examples 1A to 9A and Comparative Examples 1A to 3A were each applied onto a copper sputtered film provided on a silicon wafer substrate using a spin coater. After that, the coating film was heated at a temperature of 120° C. for 60 seconds using a hot plate to form a resin coating having a thickness of 5 μm. The resin coating was exposed to light through a pattern mask using a stepper "NSR-i10D" (type name) manufactured by Nikon Corporation. The exposed resin coating was then heated at a temperature of 90° C. for 60 seconds, immersed in a 2.38% by mass of an aqueous solution of tetramethyl-ammonium hydroxide for 80 seconds to develop the resin coating, washed with running water, and blown with nitrogen to form each of resist patterns of Examples 1B to 9B and Comparative Examples 1B to 3B (hole patterns with a depth of 5 μm) on the substrate. The substrate on which the resist pattern was formed is referred to as "patterning substrate". Using this patterning substrate, the "resolution" and "plating solution resistance" were evaluated by the methods which will be indicated below.

"Resolution"

The patterning substrate was observed with a scanning electron microscope, and the resolution was evaluated according to the following criteria. The evaluation results are indicated in Table 3.

A: A hole pattern of 0.7 μm in length×0.7 μm in width could be resolved.

B: A hole pattern of 0.7 μm in length×0.7 μm in width could not be resolved, but a hole pattern of 1 μm in length×1 μm in width could be resolved.

C: A hole pattern of 1 μm in length×1 μm in width could not be resolved.

"Plating Solution Resistance (Swelling Resistance)"

The patterning substrate was immersed in 300 mL of a copper plating solution "CU8502" (product name) manufactured by Dow Chemical Co., Ltd. at a temperature of 23° C. for 10 minutes, and the resist pattern shapes before and after the immersion were observed with an optical microscope and a scanning electron microscope to evaluate plating solution resistance (swelling resistance) according to the following criteria.

Similarly, the patterning substrate was immersed in 300 mL of a nickel plating solution "Ni200" (product name) manufactured by EEJA at a temperature of 55° C. for 10 minutes, and the resist pattern shapes before and after the immersion were observed with an optical microscope and a scanning electron microscope to evaluate the plating solution resistance. The evaluation results are indicated in Table 3.

A: The reduction rate of the hole pattern size before and after immersion was 1% or less.

B: The reduction rate of the hole pattern size before and after immersion was larger than 1% and 10% or less.

C: The reduction rate of the hole pattern size before and after immersion was larger than 10%.

TABLE 3

| | Photosensitive resin composition | Resolution | Plating solution resistance (swelling resistance) | |
|---|---|---|---|---|
| | | | Copper plating solution | Nickel plating solution |
| Example 1B | Example 1A | A | A | A |
| Example 2B | Example 2A | A | A | A |
| Example 3B | Example 3A | A | A | A |
| Example 4B | Example 4A | A | A | A |
| Example 5B | Example 5A | A | A | A |
| Example 6B | Example 6A | A | A | A |
| Example 7B | Example 7A | A | A | A |
| Example 8B | Example 8A | A | A | A |
| Example 9B | Example 9A | A | A | A |
| Comparative Example 1B | Comparative Example 1A | C | A | A |
| Comparative Example 2B | Comparative Example 2A | B | A | A |
| Comparative Example 3B | Comparative Example 3A | A | C | A |

<Production of Plated Formed Article>

Examples 1C to 9C and Comparative Examples 1C to 3C

Each of the patterning substrates of Examples 1B to 9B and Comparative Examples 1B to 3B was subjected to ashing treatment with oxygen plasma (output: 100 W, oxygen flow rate: 100 mL/min, and treatment time: 60 seconds). The patterning substrate after the ashing treatment was immersed in 300 mL of a copper plating solution "CU8502" (product name) manufactured by Dow Chemical Co., Ltd., and subjected to electrolytic plating at a plating bath set to a temperature of 23° C. and a current density of 2 Å/dm² for 9 minutes, thereby producing a plated formed article (metal pattern). The resist pattern after producing the plated formed article was observed with an optical microscope and a scanning electron microscope to evaluate the "plating solution resistance (crack resistance)" according to the following criteria.

Similarly, the patterning substrate after the ashing treatment was immersed in 300 mL of a nickel plating solution "Ni200" (product name) manufactured by EEJA, and subjected to electrolytic plating at a plating bath set to a temperature of 55° C. and a current density set to 3 Å/dm² for 6.5 minutes, thereby producing a plated formed article (metal pattern). Similarly, the plating solution resistance (crack resistance) of the resist pattern was evaluated. The evaluation results are indicated in Table 4.

A: There were no cracks in the resist pattern.
B: There were 1 crack/μm² or more and less than 1,000 cracks/μm² in the resist pattern.
C: There were 1,000 or more cracks/μm² in the resist pattern.

TABLE 4

| Patterning substrate | | Plating solution resistance (crack resistance) | |
| --- | --- | --- | --- |
| | | Copper plating | Nickel plating |
| Example 1C | Example 1A | A | A |
| Example 2C | Example 2A | A | A |
| Example 3C | Example 3A | A | A |
| Example 4C | Example 4A | A | A |
| Example 5C | Example 5A | A | A |
| Example 6C | Example 6A | A | A |
| Example 7C | Example 7A | A | A |
| Example 8C | Example 8A | A | A |
| Example 9C | Example 9A | A | A |
| Comparative Example 1B | Comparative Example 1A | A | B |
| Comparative Example 2B | Comparative Example 2A | A | C |
| Comparative Example 3B | Comparative Example 3A | A | A |

The invention claimed is:

1. A method for forming a resist pattern, comprising:
applying a photosensitive resin composition onto a substrate to form a resin coating;
exposing the resin coating to light having a wavelength of 150-600 nm; and
developing the resin coating with an alkaline developer after the exposure,
wherein the photosensitive resin composition comprises:
a polymer (A) comprising a structural unit (a1) represented by formula (a1), a structural unit (a2) represented by formula (a2), and a structural unit (a3) represented by formula (a3); and
a photoacid generator (B):

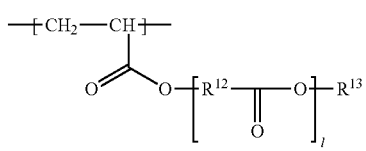

(a1)

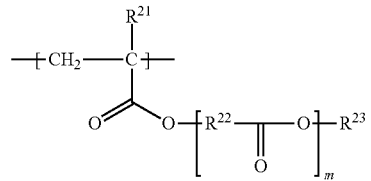

(a2)

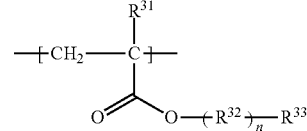

(a3)

wherein in the formulae (a1) to (a3), $R^{12}$, $R^{22}$, and $R^{32}$ each independently represent an organic group having 1 to 10 carbon atoms; $R^{21}$ represents a substituted or non-substituted alkyl group having 1 to 10 carbon atoms; $R^{31}$ represents a hydrogen atom, a substituted or non-substituted alkyl group having 1 to 10 carbon atoms, or a halogen atom; $R^{13}$ and $R^{23}$ each independently represent an acid dissociable group; $R^{33}$ represents a hydroxyaryl group; l and m independently represent an integer from 0 to 10; and n is 0, and
wherein a content of the structural unit (a1) in the polymer is 5 to 30% by mol relative to 100% by mol of all structural units in the polymer, and a content of the structural unit (a2) in the polymer is 5 to 30% by mol relative to 100% by mol of all structural units in the polymer.

2. A method for manufacturing a plated formed article, comprising performing a plating using a resist pattern formed by the method according to claim 1 as a mask.

3. The method for manufacturing a plated formed article according to claim 2, wherein the plating is at least one selected from a copper plating and a nickel plating.

4. A semiconductor device comprising a plated formed article obtained by the method according to claim 2.

5. A semiconductor device comprising a plated formed article obtained by the method according to claim 3.

6. The method for forming a resist pattern according to claim 1, wherein a content ratio of the structural unit (a3) contained in the polymer (A) is in a range from 5% to 70% by mol when a total of all the structural units constituting the polymer (A) is 100% by mol.

7. The method for forming a resist pattern according to claim 1, wherein a total content ratio of the structural units (a1) to (a3) contained in the polymer (A) is in a range from 50% to 100% by mol when a total of all the structural units constituting the polymer (A) is 100% by mol.

8. The method for forming a resist pattern according to claim 1, wherein a content of the photoacid generator (B) included in the photosensitive resin composition is in a range from 0.1 to 20 parts by mass based on 100 parts by mass of the polymer (A).

9. The method for forming a resist pattern according to claim 1, wherein the photosensitive resin composition further comprises an organic solvent (C), wherein a content ratio of the organic solvent (C) included in the photosensitive resin composition is an amount such that a solid content concentration is in a range from 10% to 60% by mass.

10. The method for forming a resist pattern according to claim 1, wherein a content of the structural unit (a1) in the polymer is 10 to 20% by mol relative to 100% by mol of all structural units in the polymer, and a content of the structural unit (a2) in the polymer is 10 to 20% by mol relative to 100% by mol of all structural units in the polymer.

11. The method for forming a resist pattern according to claim 1, wherein in the formula (a3), $R^{33}$ is a hydroxyphenyl group.

12. The method for forming a resist pattern according to claim 1, wherein a content ratio of the structural unit (a3) contained in the polymer (A) is in a range from 20% to 60% by mol when a total of all the structural units constituting the polymer (A) is 100% by mol.

13. The method for forming a resist pattern according to claim 12, wherein in the formula (a3), $R^{33}$ is a hydroxyphenyl group.

14. A method for manufacturing a plated formed article, comprising performing a plating using a resist pattern formed by the method according to claim 6 as a mask.

15. The method for manufacturing a plated formed article according to claim 14, wherein the plating is at least one selected from a copper plating and a nickel plating.

16. A semiconductor device comprising a plated formed article obtained by the method according to claim 14.

17. A semiconductor device comprising a plated formed article obtained by the method according to claim 15.

* * * * *